United States Patent [19]

Dumoulin

[11] Patent Number: 4,899,211
[45] Date of Patent: Feb. 6, 1990

[54] SEMICONDUCTOR COOLING MECHANISMS

[75] Inventor: Jean-Loup Dumoulin, Chanpagne-sur-Seine, France

[73] Assignee: Jeumont Schneider Corporation, Cedex, France

[21] Appl. No.: 2,460

[22] Filed: Jan. 12, 1987

[30] Foreign Application Priority Data

Jan. 16, 1986 [FR] France ................ 86 00544

[51] Int. Cl.⁴ .................................. H01L 25/04
[52] U.S. Cl. ........................ 357/82; 165/104.33; 361/385
[58] Field of Search ............ 357/82; 165/104.33; 361/385

[56] References Cited

U.S. PATENT DOCUMENTS

| | | | |
|---|---|---|---|
| 3,792,318 | 2/1974 | Fries et al. | 357/82 |
| 4,036,291 | 7/1977 | Kobayashi et al. | 357/82 |
| 4,126,883 | 11/1978 | Martin | 357/82 |
| 4,188,996 | 2/1980 | Pellant et al. | 357/82 |
| 4,561,040 | 12/1985 | Eastman et al. | 357/82 |
| 4,574,877 | 3/1986 | Klein | 357/82 |

FOREIGN PATENT DOCUMENTS

| | | | |
|---|---|---|---|
| 56-79458 | 6/1981 | Japan | 357/82 |
| 56-115549 | 9/1981 | Japan | 357/82 |
| 56-122150 | 9/1981 | Japan | 357/82 |

OTHER PUBLICATIONS

"Cooling Device for Multilayer Ceramic Modules", B. T. Clark et al., IBM Technical Disclosure Bulletin, vol. 20, No. 5, Oct. 1977, pp. 1769–1771.

*Primary Examiner*—Rolf Hille
*Assistant Examiner*—Steven Loke
*Attorney, Agent, or Firm*—Rines and Rines, Shapiro and Shapiro

[57] ABSTRACT

A cooling mechanism for power semiconductors comprises a metallic evaporator (1) filled with a heat-carrying fluid and designed to be brought into close contact with one face of a semiconductor (2); at least one condenser constituted by a tube (5) whose inner wall bears a capillary structure, and which is closed at one end and extended at the other end by a conduit (7) of insulating material; and an envelope (8) enclosing the tube (5) and attached at the upper part of the conduit (7) so as to create a chamber (11) for the circulation of a cooling fluid, with the conduit (7) being connected to the evaporator (1) by an elastic piece (14). The pressure inside the assembly constituted by the evaporator (1), the condenser(s) (5) and the conduit (7) is lower than atmospheric pressure, and cooling is effected by an evaporation-condensation cycle.

21 Claims, 2 Drawing Sheets

SEMICONDUCTOR COOLING MECHANISMS

The present invention concerns devices for cooling of high power semiconductors, particularly thyristors, diodes and transistors.

These power semiconductors, installed in rectifier assemblies especially in metallurgy, electrochemistry, or on board ships, release a significant quantity of heat. It must be removed from the components, so that they will not be destroyed by an excessive temperature, and then removed from the room containing the equipment, to maintain an acceptable ambient temperature within it.

One solution consists of placing directly upon at least one face of the package of the semiconductor a metallic radiator, for example of copper or aluminun, cooled by air or water.

Another solution consists of immersing the assemblies including power semiconductor within a closed chamber containing a fluid or organic composition. Heat exchange between the semiconductors and the walls of the chamber is effected by changing of phase of the fluid, with the exterior surface of the chamber being cooled by circulation of air or water.

These solutions present several drawbacks.

In systems utilizing air-cooled radiators, large exchange surfaces between the radiators and the ambient air are necessary to obtain acceptable heat transfer. This cooling system is thus very cumbersome. The heat transfer can be improved by increasing the flow of air by means of ventilators, but these are also cumbersome, as well as noisy.

Moreover, warm air is discharged directly into the room in which the equipment is located. This necessitates the installation of air-conditioning apparatus which, if outside the room, requires ducts for supply and removal of air, generally of large volume.

It addition, a supply of clean air is necessary to avoid electrical discharges between radiators which are at different potentials, thus frequently necessitating air filters.

In systems using water-cooled radiators, the heat can be extracted by the water directly to the outside, or to a secondary refrigerant. However, to ensure the circulation of water, the radiators which are at the potential of the semiconductors are connected to one another by tubes of an insulating material, of greater or lesser length according to the voltage value.

The circulating water, subjected to electric fields, must be very pure, and must remain so. Because the quality of the water degrages rather rapidly, monitoring and regenerating mechanisms are necessary to maintain suitable resistivity of the water. These mechanisms are burdensome, all the more the higher the voltage applied.

Systems utilizing a chamber filled with a cooling fluid capable of changing phase are insensitive to pollution of the cooling fluid, because only the connection terminals outside of the chamber are under voltage. However, this solution is inconvenient because it necessitates special semiconductors and auxiliary components compatible with the fluid.

The costs of replacement, corresponding to that of a complete chamber, are high and maintenance is difficult.

The present invention has as its goal to alleviate these drawbacks. A mechanism is proposed which positively ensures the extraction of heat from power semiconductors and its removal to the exterior, which presents the following advantages:

very good heat transfer as compared with that of air- and water-cooled radiators; the possibility of use of industrial quality water, not requiring a particular dielectric character, for extraction of heat to the exterior; a simple construction.

In addition, this apparatus requires neither a filter nor a regenerator system for the cooling fluid, nor an air conditioning mechanism. Finally, this mechanism is noiseless.

The present invention thus has as its object an improved cooling mechanism for power semiconductors. In summary, such comprises a metallic evaporator filled with a heat-carrying fluid and designed to be in close contact with one face of the semiconductor, at least one condenser comprising a to be whose internal wall has a capillary structure and which is closed at one end and extended at the other end by a conduit of insulating material, and an envelope enclosing the tube, fixed at the upper part of the conduit so as to create a chamber for the circulation of a cooling fluid, the conduit being connected to the evaporation by an electric section, and the pressure within the assembly constituted by the evaporator and, condenser(s) being lower than atmospheric pressure.

The invention will be better understood, and other goals, advantages and characteristics of the invention will be made clearer by the following description, given with reference to the accompanying drawing figures which represent examples of the invention.

Figure 1:
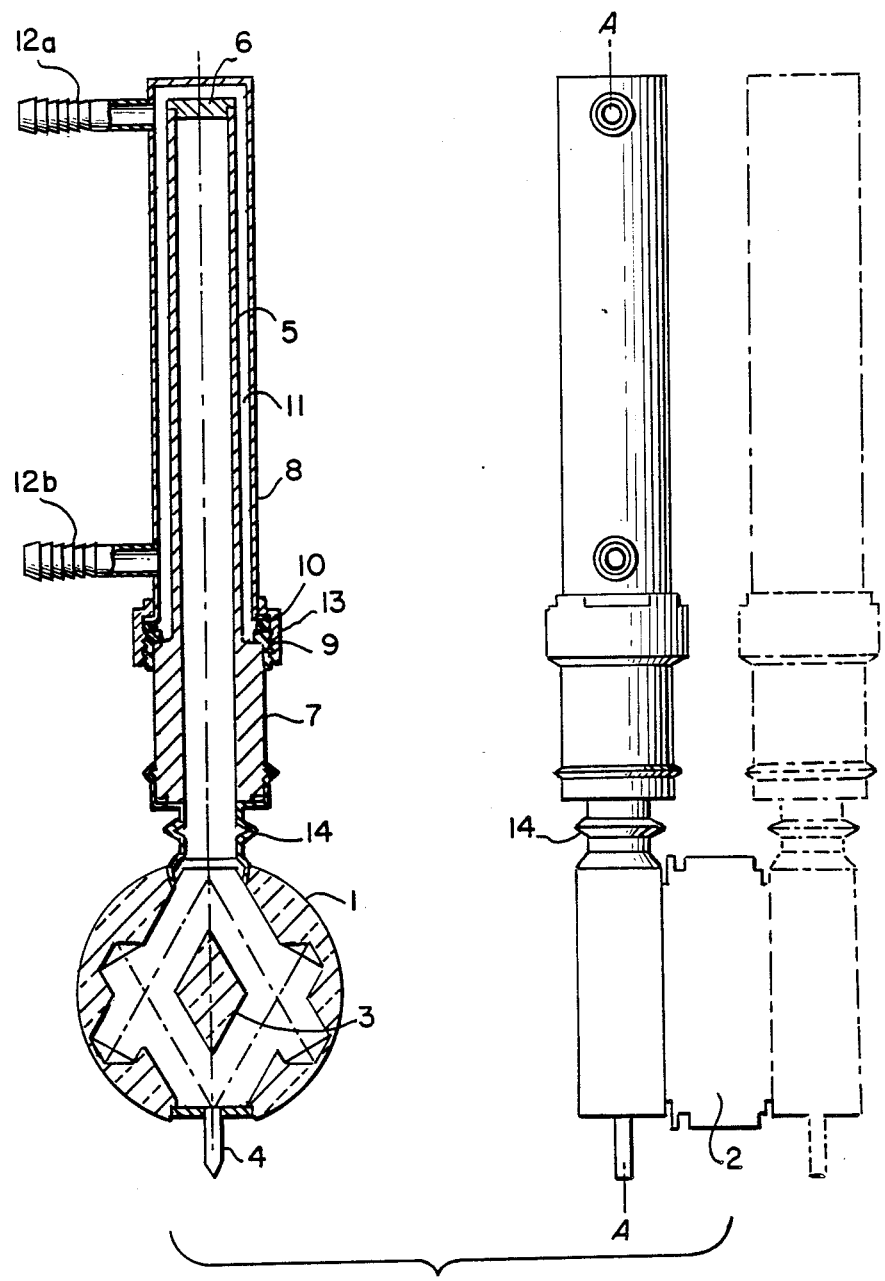
FIG. 1 represents an examplary embodime of the invention, in overview, and in section along the line A—A.

Referring to FIG. 1, the cooling mechanism according to the invention consists essentially of a metallic evaporator 1, a condenser 5 constituted by a tube of insulating material, a conduit 7, also of insulating material, and formed, for example, together with the tube 5 as a single piece, and a section 14 connecting the condenser and the evaporator.

The evaporator 1 is adapted to the form of the package of a semiconductor 2, so as to be able to be placed in contact with one face of the package. It can be made of copper.

The condenser is preferably made of a ceramic with an aluminum base, which is an excellent electrical insulator and a relatively good thermal conductor. In addition, this type of ceramic lends itself readily to applications of hermetic ceramic-metal connection.

The condenser tube is hermetically sealed in its upper portion by an insulating plug 6.

Its internal wall includes a capillary structure, in particular a latticed wick, which can be metallic.

The assembly constituted by the condenser 5 and the conduit 7 is attached to the upper part of the evaporator by the section 14, made preferably of copper. It enables differences of expansion between the insulation and the metal to be taken up.

The evaporator 1 is filled with a heat-carrying fluid, and its internal wall is designed so as to present a large exchange surface with the fluid. It presents a cross section of metal capable of conducting the maximum electric current delivered by the semiconductor, and, at its center, has a rigid core 3 which bears the forces of attachment to the semiconductors.

A tube of copper 4 attached to the lower part of the evaporator 1 makes it possible to carry out operations of cleaning, degassing, emptying and filling.

The conduit 7 is an extension of the tube 5, for example of greater thickness, so as to provide mechanical reinforcement of the tube. A tube with the same axis as the tube 5, and of greater diameter, constituting an envelope 8 enclosing the tube 5, is attached to the upper portion of the conduit 7, for example by the means of a section 10 solidly attached to the envelope, and attached to a piece 9 brazed to the conduit, with a joint 13 being installed between these two parts.

The envelope 8 can be removed easily for cleaning of the external surface of the condensoer.

A chamber 11 is thus created between the tube 5 and its envelope 8. Two fluted nipples 12a and 12b are installed in the evelope 8, and enable the chamber 11 to be connected to an industrial water supply. The outer wall of the condenser is thus cooled by the circulation of water within the chamber 11.

Because the interior of the sealed assembly constituted by the condenser and the evaporator is at reduced pressure with respect to the atmosphere, the operation of the cooling mechanism according to the invention is as follows.

The heat released by the semiconductor 2 is transmitted by conductance to the evaporator 1.

Because the evaporator is under reduced pressure, the heat-carrying fluid which it contains evaporates easily. The vapor passes through the conduit 7 without substantial change in temperature, and reaches the condenser, where it cools and condenses on the interior wall. The capillary pressure of the condensates increases.

Under the effect of this pressure and gravity, the condensates return to the evaporator.

It is thus apparently necessary that the condenser be placed above the evaporator. However, an inclination of the condenser of less than 70° with respect to the vertical will not impair proper functioning of the cooling system.

The heat-carrying fluid is preferably water. It is not necessary for it to have a good dielectric characteristic, since, although it is in direct contact with the evaporator under voltage, it is insulated from the external cooling water by the insulating wall of the condenser.

Figure 2:
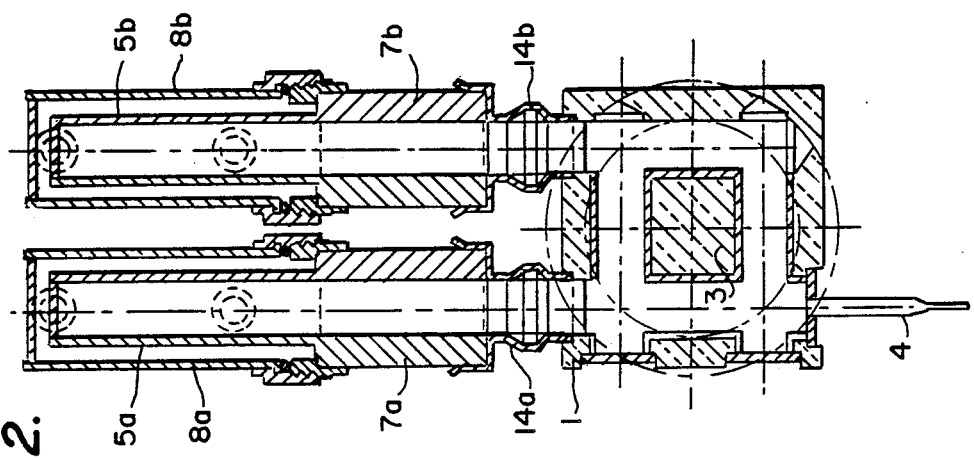
FIG. 2 represents a second embodiment of the invention.

According to the embodiment represented in FIG. 2, the evaporator 1 is designed to be connected to two condenser tubes 5a, 5b.

The constituent elements are in FIG. 2 labelled in the same manner as in FIG. 1, but are given an index a or b, according to whether they reltae to one condenser or the other.

This arrangement multiplies the number of pieces and insulator to metal connections, but it presents the advantage of substantially reducing the height of the cooling system, while preserving exchange surfaces identical to those of the basic embodiment.

It is obvious that more than two condensers can be connected to the same evaporator.

Figure 3:
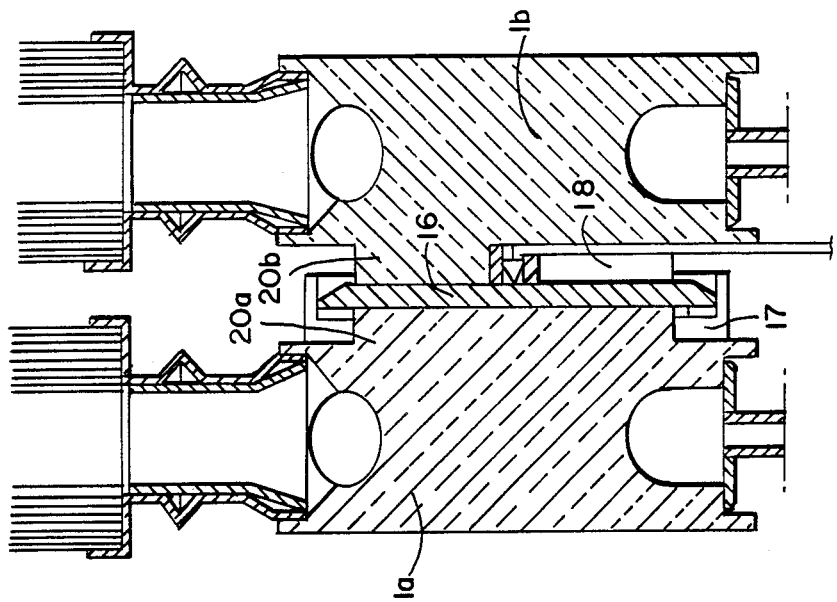
FIG. 3 represents yet another embodiment of the invention.

Referring now to FIG. 3, which represents yet another embodiment of the invention, the hermetic ceramic housing of the semiconductor 2 is eliminated.

Two cooling mechanisms are provided, and their evaporators 1a, 1b are provided with bosses 20a, 20b which serve as electrodes for the semiconductor, and which are placed directly in contact with the semiconductor chip 16.

The bosses 20a, 20b enable mounting of an insulating piece 17 for centering the bosses on the two faces of the chip 16 by engagement with the chip and boss peripheries, as shown.

In the case in which the semiconductor 2 is a thyristor, a trigger channel 18 is provided, through which the trigger wire passes to the outside.

The assembly constituted by the two evaporators 1a, 1b and the semiconductor chip 16 is placed within a casing of metallic or insulating material, and can then be immersed in a silicone gel which has the property of retaining good elasticity upon hardening. This gel ensures electrical insulation of the two faces of the chip.

For a given condenser exchange surface, this embodiment permits a gain of about 22% in energy drawn from the semiconductor relative to the basic embodiment.

According to one possible variation of embodiment, the condenser tube 5 of insulating material is replaced by a metallic tube, preferably of copper, with optimum thermic conductance.

The capillary structure of the condenser tube in this case can be constituted by a fine longitudinal grooving of the internal surface of the conductive tube.

The tube 5 is then connected to the evaporator through the intermediary of the insulating conduit 7, and the section 14 enabling differences in expansion to be taken up.

The parts attaching the external envelope 8 of the tube 5 on the conduit 7 are identical to those described in the basic embodiment, except for the part 9, which in this case is brazed both to the insulating conduit 7 and the condenser tube 5.

To obtain good insulation between the evaporator 1 and the condenser 5 in this variation, it is necessary for the insulating conduit 7 and the heat-carrying fluid to have good dielectric qualities.

It is possible to use very pure water, or an organic compound which has better dielectric qualities, but is a poorer heat carrier.

For a given condenser exchange surface, and with the same fluid, this variation enables a gain of about 19% in energy drawn from the semiconductor, relative to the basic embodiment. However, the dielectric characteristic is lower because of the internal fluid, which reduces the applicable voltage.

The lifespan is also linked to the alteration of the dielectric characteristic of the fluid with time. It can be long, howeve, because the fluid is under vacuum, and in contact only with two completely degassed materials.

Finally, it is obvious that other modifications may be made within the spirit of the invention which will not constitute a departure from the scope of the invention as set forth in the appended claims.

For example, the evaporator can be extended by an electrical connection flange, with the evaporator and flange constituted by a single metallic piece, resulting in a reduction in the number of pieces and electrical contacts.

In the second embodiment described above, (FIG. 3), the casing can include other electrical components, also surrounded by the silicone gel.

I claim:

1. A power semiconductor cooling mechanism, comprising a metallic evaporator containing a heat-carrying fluid and configured for face-to-face contact with a power semiconductor device at an axial end of said evaporator, a condenser tube extending laterally of said evaporator and having a first end which is closed and a second end which is connected in fluid communication with said evaporator by way of an electrically insulating fluid conduit, a flexible expansion-accommodating fluid connection connecting said electrically insulating fluid conduit to said evaporator, and an envelope secured to said electrically insulating fluid conduit and enclosing said condenser tube so as to define a fluid chamber about said condenser tube, said envelope having inlet and outlet means for conducting a cooling fluid through said fluid chamber to cool said condenser tube, with pressure internally of the assembly of said condenser tube, said fluid conduit, and said evaporator being below atmospheric pressure.

2. A power semiconductor cooling mechanism according to claim 1, wherein an inner wall of said condenser tube has a capillary structure.

3. A power semiconductor cooling mechanism according to claim 2, wherein said condenser tube is formed of electrically insulating material and wherein said capillary structure is constituted by a lattice work.

4. A power semiconductor cooling mechanism according to claim 3, wherein said condenser tube and said electrically insulating fluid conduit are formed as a single piece.

5. A power semiconductor cooling mechanism according to claim 3, wherein said heat-carrying fluid is water.

6. A power semiconductor cooling mechanism according to claim 1, wherein said condenser tube is metallic and said capillary structure is constituted by longitudinal grooving in said wall of said condenser tube.

7. A power semiconductor cooling mechanism according to claim 6, wherein said heat-carrying fluid is a dielectric fluid.

8. A power semiconductor cooling mechanism according to claim 1, wherein said evaporator has rigid core means for bearing forces of attachment of said evaporator to said power semiconductor device.

9. Power semiconductor apparatus, comprising a power semiconductor device and a cooling mechanism for cooling said power semiconductor device, said cooling mechanism including:
a metallic evaporator containing heat-carrying fluid and disposed in heat-conductive contact with a face of said power semiconductor device at an axial end of said evaporator, at least one condenser tube extending laterally upwardly relative to said evaporator, said condenser tube having a closed upper end and a lower end which is connected in fluid communication with said evaporator by way of an electrically insulating fluid conduit, and an envelope secured to said electrically insulating fluid conduit and enclosing said condenser tube so as to define a fluid chamber about said condenser tube, said envelope having inlet means and outlet means for circulating a cooling fluid through said chamber to withdraw heat from said condenser tube, with pressure internally of the assembly of said evaporator, said condenser tube, and said fluid conduit being below atmospheric pressure.

10. Power semiconductor apparatus according to claim 9, whereein said condenser tube is formed of electrically insulating material.

11. Power semiconductor apparatus according to claim 10, wherein said electrically insulating fluid conduit is connected to said evaporator by a flexible expansion-accommodating connection.

12. Power semiconductor apparatus according to claim 10, comprising a plurality of said condenser tubes, each extending laterlly upwardly relative to said evaporator and coupled to said evaporator by a respective electrically insulating fluid conduit as aforesaid, and each being enclosed by a corresponding envelope as aforesaid.

13. Power semiconductor apparatus according to claim 10, wherein said condenser tube and said electrically insulating fluid conduit are substantially straight and substantially axially aligned.

14. Power semiconductor apparatus according to claim 13, wherein said condenser tube and said fluid conduit are arranged at no more than about 70° with respect to vertical.

15. Power semiconductor apparatus according to claim 10, wherein said envelope comprises another tube which encloses said condenser tube and is substantially concentric therewith.

16. Power semiconductor apparatus according to claim 15, wherein said another tube has a lower end secured to said electrically insulating fluid conduit.

17. Power semiconductor apparatus according to claim 9, wherein said device is a power semiconductor chip, and said evaporator has a boss in face-to-face contact with said chip, and further including means centering said boss relative to the contact face of said chip.

18. Power semiconductor apparatus according to claim 17, wherein said centering means effects said centering by contact with the respective peripheries of said boss and said chip.

19. Power semiconductor apparatus according to claim 17, wherein said chip is triggered controlled and said evaporator has a channel accommodating a trigger conductor connected to said chip.

20. A power semiconductor cooling mechanism, comprising a metallic evaporator containing a heat-carrying fluid and having an axial end face for placement against a face of a power semiconductor device, a substantially straight condenser tube extending laterally of said evaporator and having a first end which is closed and a second end which is open and connected in fluid communication with said evaporator by way of an electrically insulating fluid conduit extending substantially axially from said condenser tube, said electrically axially fluid conduit being connected to said evaporator by a flexible expansion-accommodating connection, and a tubular envelope secured to said electrically insulating fluid conduit in substantialy concentric relationship with said condenser tube and enclosing said condenser tube so as to define a fluid chamber about said condenser tube, said tubular envelope having inlet means and outlet means for circulating cooling fluid through said chamber, with pressure internally of the assembly of said evaporator, said fluid conduit, and said condenser tube being below atmospheric pressure.

21. A power semiconductor cooling mechanism according to claim 20, wherein said condenser tube is formed of electrically insulating material.

* * * * *